United States Patent [19]

Ovshinsky

[11] 4,177,473

[45] Dec. 4, 1979

[54] AMORPHOUS SEMICONDUCTOR MEMBER AND METHOD OF MAKING THE SAME

[75] Inventor: Stanford R. Ovshinsky, Bloomfield Hills, Mich.

[73] Assignee: Energy Conversion Devices, Inc., Troy, Mich.

[21] Appl. No.: 797,929

[22] Filed: May 18, 1977

[51] Int. Cl.$^2$ .................................. H01L 45/00
[52] U.S. Cl. ........................................ 357/2; 357/4; 357/61; 357/63; 148/15
[58] Field of Search ............................ 357/2, 4, 61, 63

[56] References Cited

U.S. PATENT DOCUMENTS

| | | | |
|---|---|---|---|
| 3,688,160 | 8/1972 | Nagasawa | 317/238 |
| 3,716,844 | 2/1973 | Brodsky | 340/173 LS |
| 3,864,717 | 2/1975 | Merrin | 357/2 |
| 3,983,542 | 9/1976 | Ovshinsky | 340/173 |

OTHER PUBLICATIONS

Shimakawa, *Japan J. Appl. Phys.*, 10 (1971), pp. 1116–1117.
Petersen et al., *IEEE Transactions on Electron Devices*, vol. ED-23, No. 4, Apr. 1973, pp. 471–477.
Spear, *Proceed. 5th Int. Conf. on Amorphous Semiconductors*, Partenkirche, Fed. Rep. Germany, Sep. 3–8, 1973.

*Primary Examiner*—Martin H. Edlow
*Attorney, Agent, or Firm*—Wallenstein, Spangenberg, Hattis & Strampel

[57] ABSTRACT

An amorphous semiconductor member includes an amorphous semiconductor material which is formed in a solid amorphous host matrix having structural configurations which have local rather than long-range order and electronic configurations which have an energy gap and a large electrical activation energy, and, added to the amorphous host matrix, a modifier material having orbitals which interact with the amorphous host matrix and form electronic states in the energy gap which modify substantially the electronic configurations of the amorphous host matrix for reducing substantially the activation energy thereof and, hence, increasing substantially the electrical conductivity of the semiconductor member substantially at room temperature and above. The amount of addition of the modifier material controls the range of electrical conductivity, and can be greater than dopant amounts usually used for doping semiconductors. The amorphous host matrix is normally of intrinsic-like conduction and the modifier material added thereto changes the same to extrinsic-like conduction. In one form of the invention, a primarily lone-pair amorphous semiconductor material having orbitals is utilized wherein the orbitals of the modifier material interact with the orbitals of the amorphous host matrix and form the electronic states in the energy gap. In another form, a primarily tetrahedral bonding amorphous semiconductor material is utilized wherein the orbitals of the modifier material, added primarily in a non-substitutional manner, interact with the amorphous host matrix and form the electronic states in the energy gap. In a further form, an amorphous semiconductor material containing boron is utilized wherein the orbitals of the modifier material interact with the amorphous host matrix and form the electronic states in the energy gap.

96 Claims, 15 Drawing Figures

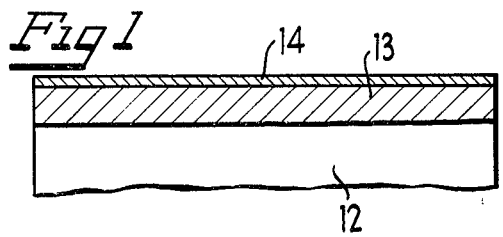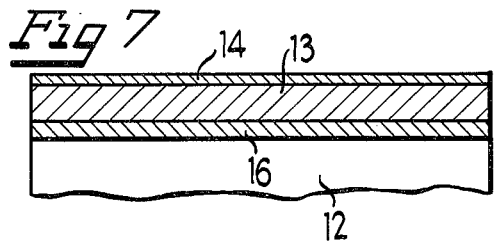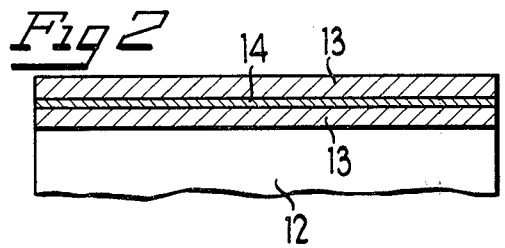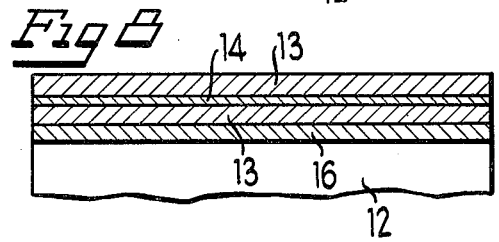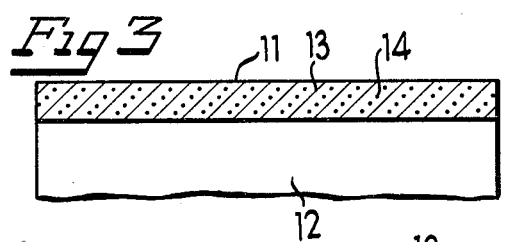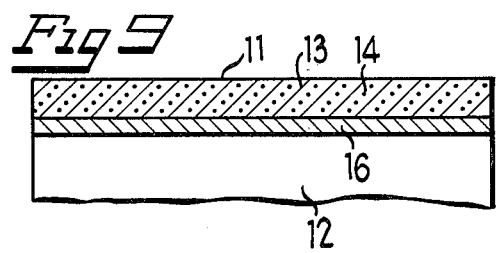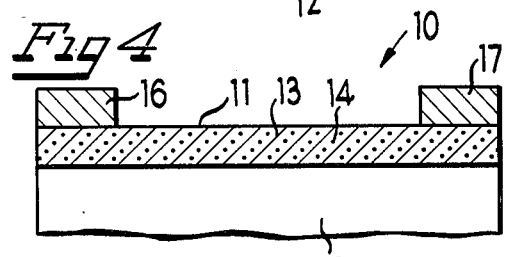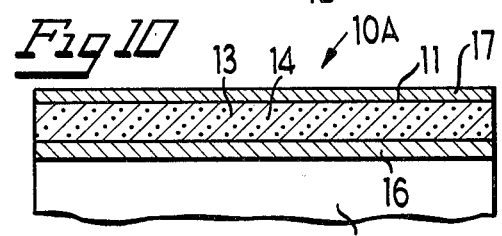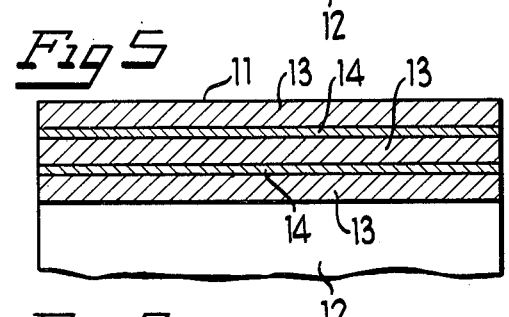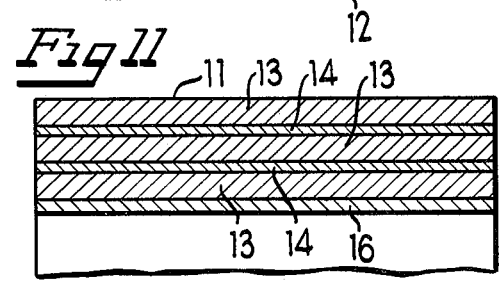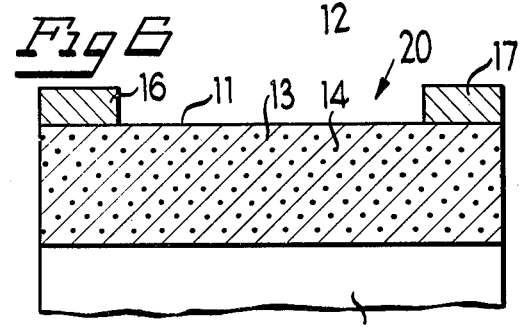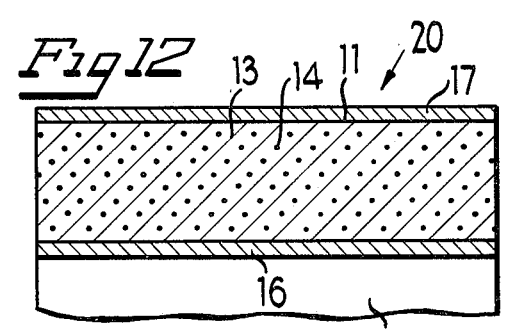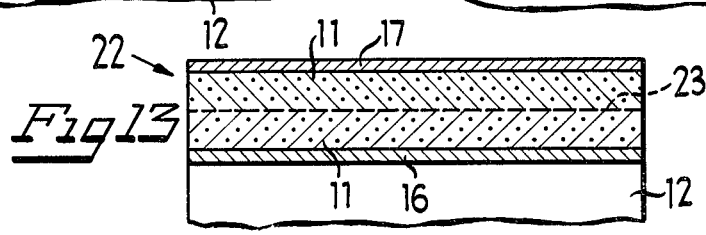

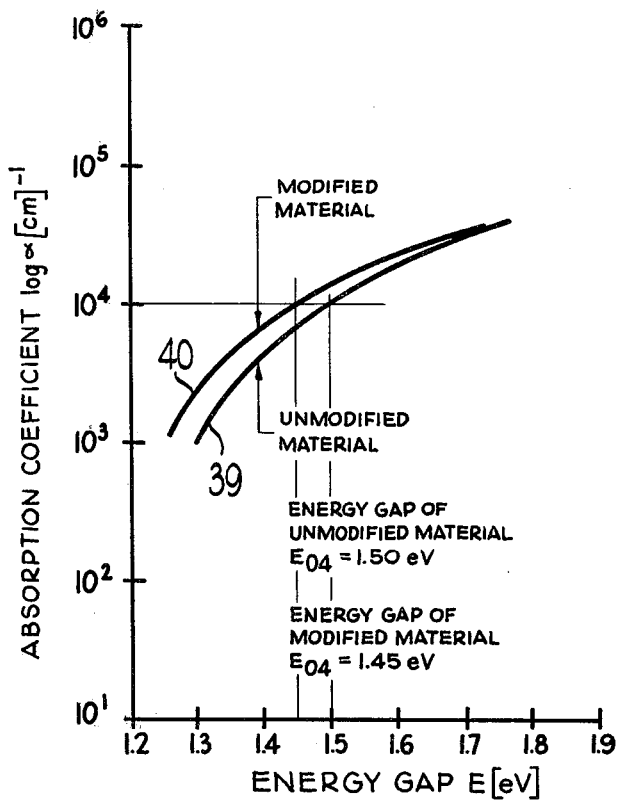
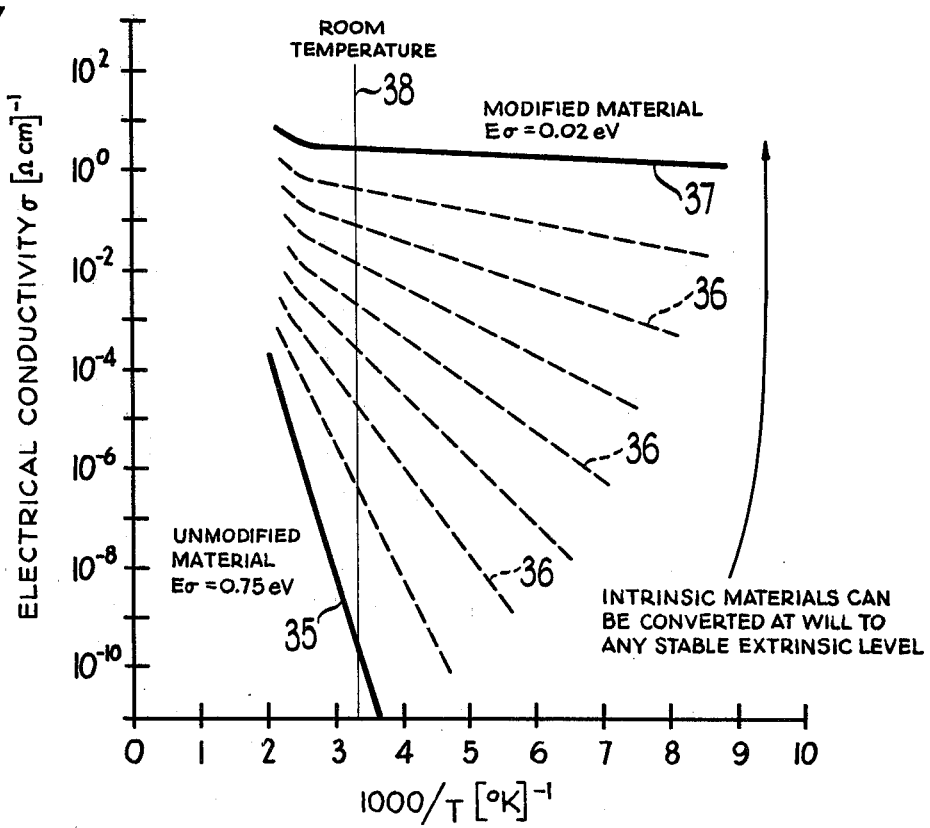

AMORPHOUS SEMICONDUCTOR MEMBER AND METHOD OF MAKING THE SAME

The principal object of this invention is to provide amorphous semiconductor members which have characteristics superior to those found in crystalline semiconductors, such as doped crystalline silicon, germanium, or the like, and those found in amorphous semiconductors, such as compensated and doped glow discharge amorphous silicon, germanium, or the like, and which have wide applications of usage including current generation devices such as thermoelectric or solar radiation devices, current control devices such as p-n junction devices including diodes, transistors or the like, and many other applications of usage which may be brought into being by utilizing the principles of this invention.

Briefly, the amorphous semiconductor members of this invention can be made from a plurality of elements, including complex alloys thereof, which can be selected and designed for tailor-making an amorphous matrix having substantially any desired structural configurations and substantially any desired electronic configurations having a desired energy gap and electrical activation energy, to provide the semiconductor members with desired physical, thermal and optical properties, while being capable of having the electronic configurations thereof substantially independently modified for modifying the electrical activation energy to provide the semiconductor members with desired electrical properties. The amorphous semiconductor members are synthetically created, they need not be made from the melt, they do not depend upon stoichiometry, and they are not constrained by crystalline forms or inhibitions. This means that there is a whole new range of countless material combinations that can be designed to optimize desired material attributes having to do with the physical, chemical, temperature, and electrical properties of the materials.

Crystalline semiconductors became practical and formed the foundation of a huge business as well as the basis of a powerful scientific establishment. This was due to the ability to alter substantially intrinsic germanium and particularly silicon crystals into extrinsic materials and to control their being either of a p or n conduction type. This involved substantially pure crystalline materials in which parts per million or so of a dopant were carefully introduced as substitutional impurities into the substantially pure crystalline materials to increase the electrical conductivity thereof and to control their being either of a p or n conduction type. This was done by the achievement of growing individual single crystals under carefully controlled conditions and the doping of such single crystals with extremely small and critical amounts of dopants also under carefully controlled conditions. In such crystalline semiconductors, purity, cleanliness, complex and sophisticated crystal growing and doping techniques became the center of an industry that has made the computer possible, as well as transistorized radios, and the like. This revolution occurred because the scientific basis became well known, it having to do with the introduction into Group IV crystals, such as silicon and germanium, Group III dopant materials, such as boron or the like, as an acceptor, and Group V dopant materials, such as arsenic, or the like, as a donor.

With respect to the aforementioned doped crystalline semiconductors, the procedures in making the same are complex, time consuming, and expensive procedures. Also, the yield in the manufacture of such doped crystalline semiconductors leaves much to be desired. They necessarily have a fixed energy gap determined by the particular crystals utilized. Further, because of the single crystal nature of such semiconductors, they are limited in size and cannot conveniently provide devices with large dimensional or area geometry.

Because of the aforementioned difficulties in such crystalline semiconductors (doped silicon and germanium crystals), the industry attempted to look toward the use of amorphous silicon and germanium semiconductors to replace the crystalline semiconductors. Work in the amorphous material field was discouraging to the practioners for they were versed particularly in the crystalline material field. While such practioners came to acknowledge that there might be unique electronic switching and structural memory effects in amorphous materials, the mainstream of semiconducting science and technology was not impacted thereby because the amorphous materials were basically intrinsic and, therefore, it was the belief that transistors or the like could not be successfully made therefrom.

Furthermore, such work was generally unproductive since stable amorphous semiconductors of amorphous silicon or germanium could not be obtained. Amorphous silicon or germanium (Group IV) have microvoids and dangling bonds and are normally four-fold coordinated except for the microvoids and dangling bonds which produce localized states in the energy gap thereof. Such localized states remain in the amorphous silicon or germanium, whether or not doping of the amorphous material is attempted, and they are subject to annealing and other conditions, including deposition conditions and temperature and other ambient conditions, which change their characteristics and which render them sufficiently unstable so as not to be satisfactorily useable as reliable semiconductors, transistors, or the like.

To minimize the aforementioned problems involved with amorphous silicon and germanium, W. E. Spear and P. G. Le Comber of Carnegie Laboratory of Physics, University of Dundee, in Dundee, Scotland, did some work on "Substitutional Doping of Amorphous Silicon," as reported in a paper published in Solid State Communications, Vol. 17, pp. 1193–1196, 1975, toward the end of reducing the localized states in the energy gap in the amorphous silicon or germanium to make the same approximate more closely intrinsic crystalline silicon or germanium and of substitutionally doping said amorphous materials with suitable classic dopants, as in doping crystalline materials, to make them more extrinsic and of p or n conduction types. This was accomplished by glow discharge deposition wherein a gas of silane ($SiH_4$) and a gas of phosphine ($PH_3$) for n-type conduction, or a gas of diborane ($B_2H_6$) for p-type conduction, were premixed and passed through a reaction tube where the gaseous mixture was decomposed by an r.f. glow discharge and deposited on a substrate at high substrate temperature of about 500°–600° K. The material so deposited on the substrate is an amorphous material consisting of silicon and up to about 30 percent hydrogen (silicon hydride) and substitutional phosphorus or boron in dopant concentrations between about $5 \times 10^{-6}$ and $10^{-2}$ parts per volume.

As expressed above, amorphous silicon, and also germanium, is normally four-fold coordinated, and normally has microvoids and dangling bonds, producing localized states in the energy gap. The hydrogen in the silane combines with many of the dangling bonds of the silicon during the glow discharge deposition to decrease or minimize the density of the dangling bonds and microvoids in the deposited amorphous material for compensating the local states in the energy gap toward the end of making the amorphous material approximate more nearly the corresponding crystalline material. The dopants, phosphorus from Group V elements for providing n-type conduction, and boron from Group III elements for providing p-type conduction, obtained from the phosphine and diborane, respectively, were incorporated during the glow discharge deposition into the amorphous deposition in four-fold coordinated manner as a substitutional impurity for silicon in the amorphous material just as in single crystal doping.

While the density of states in the energy gap of the glow discharge amorphous silicon is substantially reduced, particularly at the Fermi level, two bumps of relatively high density states remain in the energy gap which are apparently related to the remaining dangling bond density and they are located substantially at about 0.4 eV below the conduction band $E_c$ and above the valence band $E_v$. When the flow discharge amorphous silicon is doped with phosphorus or boron, the Fermi level is believed to be moved up or down, but an insufficient amount of active sites have been affected to move the Fermi level beyond either of the bumps. Thus, the activation energy for the doped glow discharge amorphous silicon has not been lowered below about 0.2 eV. This result also places a theoretical limitation on the open-circuit photovoltage of a p-n junction of doped glow discharge amorphous silicon, since the internal field cannot exceed the separation of the Fermi level in the p and n type regions. In addition, the remaining activation energy limits the room-temperature D.C. conduction of the doped glow discharge amorphous silicon and the material would have a large sheet resistance if it were made into a large area array, the resistance not being helped by the rather low carrier mobility which is a factor of about $10^5$ less than that for crystalline silicon. As in the case of silicon crystalline semiconductors, the glow discharge amorphous semiconductors utilizing silicon have substantially fixed energy gaps.

The foregoing glow discharge amorphous silicon, which have been compensated by hydrogen to make it more closely resemble cyrstalline silicon and which has been doped in a manner like that of doping crystalline silicon, all done during the glow discharge deposition, has characteristics which in many respects are inferior to those of doped crystalline silicon and cannot be used successfully in place of doped crystalline silicon. In such glow discharge amorphous silicon there are also problems of poor adhesion to the substrates on which they are deposited and of cracking, and the like.

Instead of attempting to compensate amorphous materials to resemble more closely crystalline materials and doping the same in the manner of doping crystalline materials, as aforesaid, the instant invention has to do with working directly with disordered amorphous materials and considering the differences between the amorphous and crystalline materials rather than the similarities therebetween, with being able to select or manipulate the structural configurations and the energy gap of the electronic configurations of the amorphous materials at will and to manipulate independently the activation energy thereof at will for maximum design optimization, and with a simple technology system which can utilize substantially any element of the various columns of the periodic table which can be made up in the solid amorphous state. Thus, in accordance with the instant invention there are substantially no limitations of crystalline symmetry nor of a single energy gap as was heretofore prevalent.

The principles of this invention are applicable, among others, to solid amorphous semiconductor matrices, including Group IV elements having normal tetrahedral bonding and three-dimensional stability, Group V elements having normal trivalent bonding and two-dimensional stability (i.e., sheets), and Group VI elements having normal divalent bonding and one-dimensional stability (i.e., chains and rings). Generally speaking, the Group V and VI amorphous materials do not contain microvoids and dangling bonds as do the Group IV amorphous materials and the Group IV amorphous materials do not contain lone pairs as do the Group V and VI amorphous materials. The presence of elements from Groups III or V in the semiconductors containing Group VI elements crosslink the chains thereof, and the presence of elements from Group IV in the semiconductors containing Group V or VI elements crosslink either the sheets of Group V or the chains and rings of Group VI, so that three-dimensional stability can be accomplished in the amorphous semiconductors containing the Groups V and VI elements. The amorphous semiconductor matrix involved in this invention can include combinations and complex alloys including the aforementioned elements and materials to tailor-make the energy gap for desired physical, thermal and optical purposes while being capable of independently modifying and controlling the electrical activation energy for electrical purposes.

This approach in accordance with this invention, which is a new and basic approach, may appear strange since it has been generally thought in the art that only amorphous silicon or germanium would have any attractiveness due to their kinship to the familiar crystalline silicon or germanium known in the art, as is demonstrated by the aforesaid glow discharge amorphous silicon work done by Spear and LeComber.

Briefly, in accordance with this invention, an amorphous semiconductor material is formed in a solid amorphous matrix having structural configurations which have local rather than long-range order and electronic configurations which have an energy gap and an electrical activation energy. The solid amorphous matrix of the amorphous semiconductor material may be formed, for example, as a layer of film deposited on a cool substrate (at about 350° K.) by vacuum deposition or sputtering or the like, the structural configurations and the electronic configurations being frozen in and being in at least a quasi-equilibrium condition. While the amorphous semiconductor materials have many bonding options, the bonding of the amorphous semiconductor material, including the elements thereof, into the solid amorphous matrix can be primarily by covalent bonding, which is responsible for the strong bonds, so as to substantially maintain its integrity and its energy gap. As used herein, the normal structural bodning (NSB), which characterizes conventionally prepared amorphous materials, is the condition where each atom forms the optimal number of bonds, such as covalent bonds, primarily responsible for the cohesive energy of the amorphous solid. The energy gap —E(eV)— is the difference in energy between the states at the top of the valence band and the bottom of the conduction band. It is normally measured optically and is often referred to as the optical band gap. The energy gap is basically determined by the solid amorphous semiconductor materials forming the amorphous matrix and the structural configurations thereof.

A solid amorphous semiconductor material can have a wide spectrum of localized states in the energy gap, including bonding and nonbonding states, which are herein referred to as deviant or defect electronic configurations (DECs) and which have an effect upon the Fermi level and the electrical activation energy of the semiconductor material. Such defect electronic configurations can include substitutional impurities and vacancies, interstitials, dislocations, and so forth, which occur principally in crystalline solids because of periodic restraints therein. In solid amorphous materials, three-dimensional orbital relationships can occur which are generally prohibited in crystalline materials by reason of the periodic constraints in the latter. Other defect electronic configurations, particularly in the amorphous semiconductor materials of this invention, can include microvoids and dangling bonds, dangling bond and nearest neighbor interactions, lone pairs, lone-pair/lone-pair interactions, lone pair and nearest neighbor interactions, valence alternation pairs, dative or coordinate bonds, charge compensation, polyvalency, lone-pair compensation, hybridization, three-center bonding, $\pi$ bonding, and others, all of which operate toward pinning and affecting ther Fermi level in the energy gap of the materials and control the conduction process of the semiconductor materials.

The localized states in the energy gap and the electrical activation energy are related to the structural configuration of the amorphous matrix, to the nearest neighbor relationships of the elements in the amorphous matrix, to the aforementioned defect electronic configurations, and to electrically active centers in the amorphous matrix. The electrical activation energy —$E_\sigma$—(eV)— is the energy difference between the Fermi level and the nearest band edge (valence band or conduction band) and without modification corresponds generally to one-half the energy gap.

Also briefly, in accordance with this invention, a modifier material is added to the aforementioned solid amorphous matrix of the amorphous semiconductor material for modifying the electronic configurations thereof by forming electronic states in the energy gap, and which can change and rearrange the localized states in the energy gap. As a result, the Fermi level of the energy gap may be unpinned and shifted and the electrical activation energy of the amorphous matrix is reduced substantially for increasing substantially the electrical conductivity substantially at room temperature and above. The modifier material added to the amorphous matrix can be in amounts greater than dopant amounts usually used for doping crystalline semiconductors or for doping the aforementioned glow discharge amorphous silicon, and may be in amounts up to about 35 percent by volume. The modifier material of this invention is not merely a dopant but, instead, a true modifier which modifies the electronic configurations of the amorphous matrix (including the localized states) and the electrical activation energy thereof.

The modifier material may be added to the solid amorphous matrix of the amorphous semiconductor material, after the amorphous matrix has been formed as aforesaid, in various ways, as for example, by diffusion, including thermal diffusion where the diffusion occurs by reason of heat energy, electro-diffusion wherein the diffusion occurs by reason of electric field energy, photo-diffusion wherein the diffusion occurs by reason of radiant electromagnetic energy such as light, or cathodo-diffusion wherein the diffusion occurs by electron energy emanating from a cathode, or combinations thereof. It may also be added to the amorphous matrix by ion implantation wherein ions of the modifier material are forced into the amorphous matrix. The modifier material may also be added to the amorphous matrix by codeposition of the modifier material and the semiconductor material onto a substrate which need not be hot but which can be cool (at about 350° K.). Therefore, the modifier material may be added at a temperature below the glass transition temperature or at a temperature below the melting temperature of the semiconductor material during the formation of the amorphous matrix. The codeposition of the modifier material and the amorphous semiconductor material may be accomplished, for example, by vacuum depositing of cosputtering the materials simultaneously onto the substrate, with the result that the modifier material is added to the amorphous semiconductor material as the solid amorphous matrix is being formed, and importantly is not predicated on doping substitutionality.

The techniques of forming the solid amorphous semiconductor matrix and adding the modifier material thereto, as discussed above, are disclosed and claimed in a joint patent application in which the inventor of the instant application is a joint inventor.

If the modifier material were introduced into the bulk of the semiconductor material at temperatures above the glass transition temperatures or the melting temperatures thereof, it would probably be incorporated in the amorphous matrix as a substitutional element in the amorphous matrix, as by covalent bonding or the like, resulting in an intrinsic structure. The electrical changes would then not be as substantial as the reduction of the electrical activation energy provided for in the instant invention. Instead, the modifier material is added to the amorphous matrix of the amorphous semiconductor material at temperatures below the glass transition temperature or the melting temperature of the amorphous matrix so that the amorphous matrix remains substantially intact, and minimal, if any, change occurs in the structural configuration of the amorphous matrix and in the energy gap of the electronic configuration thereof when the modifier material is so added. It may be desirable, although not entirely necessary, to heat the amorphous matrix somewhat, as the modifier material is being added thereto by diffusion, so as to relax the amorphous matrix to provide the most stable environment for the diffusion of the modifier material and maximum stability in terms of matrix (host) and modifier. While the modifier material is preferably introduced into the amorphous matrix while the latter is in at least a quasi-equilibrium condition, the amorphous matrix may be placed in a non-equilibrium condition, as by the application of an electric field or radiant energy thereto, when the modifier material is added thereto, to produce variant modifications in the electronic configuration of the amorphous matrix.

The modifier material added to the amorphous matrix of the amorphous semiconductor material may be positioned and held in position by various physical and chemical means, as for example, by coulombic forces, or with bonding thereto by a wide spectrum of bonding, including covalent bonding, as for example, dative or coordinate bonding, interaction of the orbitals of the modifier material with the amorphous matrix, or the like, and various combinations thereof.

When the modifier material is added to the solid amorphous matrix in accordance with this invention, it sees many different sites therein, including, among others, nearest neighbor relationships, element spacings, bond angles and strengths, charged and localized states in the band gap, microvoids, dangling bonds, lone pairs, and the like, which it would not see if introduced in the bulk or above the glass transition temperature or melting temperature of the amorphous material, and the modifier material can seek out these sites and readily modifiy the electronic configuration of the amorphous matrix by forming desired electronic states in the energy gap thereof (and which can also modify the localized states in the energy gap) for reducing the activation energy thereof. Where the amorphous matrix initially has localized states, microvoids, dangling bonds, lone pairs, or the like, the modifier material added to the amorphous matrix can also, at least in part, deactivate the same in addition to forming new electronic states.

The modifier material added to the amorphous host matrix has orbitals which interact with the amorphous host matrix and form electronic states in the energy gap which modify substantially the electronic configurations of the amorphous host matrix for reducing substantially the electrical activation energy thereof. The modifier materials may comprise elements selected from Groups I, II, and III of the periodic table, as for example, indium, gallium, or aluminum, which have sp orbitals, transition metals, as for example, nickel, tungsten, vanadium, copper, zinc, molybdenum, rhoudium, or iron, which have d orbitals, and rare earth elements which have d and f orbitals. The transition metals having d orbitals, which at least atomically are not full, are generally preferred since such d orbitals thereof have a greater spectrum of interaction possibilities with the amorphous host matrix than the sp orbitals of the Groups I, II, or III elements. The amorphous host matrix may be formed from a primarily lone-pair amorphous semiconductor material, including elements selected from Group VI of the periodic table, as for example, tellurium, selenium, sulphur, and Group V of the period table where lone pairs can play a role, such as, arsenic, primarily tetrahedral bonding amorphous semiconductor materials selected from Group IV of the period table, as for example, silicon, and/or carbon, or from Groups III and V, or from Groups II and VI of the periodic table which combinations are also primarily tetrahedral bonding, and amorphous semiconductor materials containing boron from Group III of the periodic table with or without carbon.

The the various amorphous semiconductor materials formed into the amorphous matrix, fine results are obtained, in accordance with the best mode of this invention, with the primarily lone-pair materials, such as those containing Group VI elements including tellurium, selenium, and/or sulphur, and Group V elements including arsenic, all of which can provide bonds, including covalent bonds, for bonding the same into the amorphous matrix and lone pairs which are capable of interacting with the orbitals of the modifier material for forming dative or coordinate bonds. As stated above, such amorphous matrix may also include strong cross-linking elements, such as the Group IV elements including silicon and germanium, which are bonded by bonds, including covalent bonding, with the Group VI elements in the amorphous matrix so that the amorphous matrix substantially maintains its structural configuration of local rather than long-range order and the energy gap of its electronic configuration. By appropriate selection of these elements and the relative amounts of the selected elements, or by utilizing additional elements in the amorphous matrix, the structural configuration may be selected or designed to provide the electronic configurations with substantially any desired energy gap. Thus, the amorphous matrix of such solid amorphous semiconductor materials may be tailored to provide desired energy gaps therein.

In the amorphous matrix of the amorphous semiconductor materials, including the Group VI elements, which have a chain or ring geometric configuration, there is much more separation between the structural bonds and the electronic configurations than in many other amorphous semiconductor materials, for example, the tetrahedral Group IV elements, such as silicon and germanium, which have a substantially rigid geometric configuration, since the Group VI elements are polymeric type elements with the possibility of bond bending or twisting, and the electronic configurations of the amorphous matrix are comprised primarily with lone pairs and their interactions with their nearest neighbors. These amorphous semiconductor materials are generally compensated structurally to be intrinsic and are considered "ideal" amorphous materials since they have few, if any, dangling bonds and no microvoids, they being spin compensated. These are contrasted to the tetahedral amorphous semiconductor materials, silicon and germanium of Group IV, which have dangling bonds and microvoids which provide spins that are detectable by spin-resonance means.

Modifier materials, such as the Group I elements, including lithium, the Group II elements, and the Group III elements, including indium and gallium, having sp orbitals, the transition metal elements including, for example, nickel, tungsten, molybdenum, iron, vanadium, rhodium, zinc or copper, having d orbitals, and the rare earth elements having d and f orbitals may be readily added to the amorphous matrix of the solid amorphous semiconductor materials, including the Group VI elements, by diffusion, codeposition, or the like, in the manners discussed above with exceptional results being obtained, particularly with the Group III elements and the transition metals.

The addition of these modifier materials to the amorphous matrix primarily dose not affect the structural bonds of the structural configurations of the amorphous matrix or the energy gap thereof in any substantial manner, even though some of the modifier material may be incorporated in the structural bonds. However, they do affect the localized states or the electrically active centers, in the energy gap and the electrical activation energy of the electronic configurations to a substantial degree for transforming the amorphous matrix from an intrinsic semiconductor to an extrinsic semiconductor. In this connection, the modifier material interacts with the solid amorphous materials of the amorphous matrix to form electronic states or electrically active centers and much of this involves the interaction of the orbitals of the modifier material with the lone pairs of the amorphous matrix. Thus, the addition of the modifier materials to the amorphous semiconductor materials in the amorphous matrix can have a minimal effect on the structural configurations and energy gap, but can have a spectrum of effects from subtle to drastic upon the electronic configurations and the activation energy.

The electronic states or electrically active centers so produced involve the production of electrically charged centers. At the same time, any localized states or electrically active centers which may be present in the amorphous matrix, as may be caused by the lone pairs, valence alternation pairs and the like, can be substantially deactivated so that the electronic states or electrically active centers provided by the modifier material essentially determine the electronic states in the energy gap and the electrical activation energy. The density of localized states or electrically active centers in this amorphous matrix of the lone-pair amphorous semiconductor material is substantially altered by the modifier material added thereto and substantially no bumps of relatively high density states remain in the energy gap between the Fermi level and the conduction band or valence band, as in the glow discharge amorphous silicon, as discussed above. As a result, the Fermi level may be shifted in appreciably greater degrees in the energy gap toward the conduction or the valence bands by the modifier material to provide appreciably greater reductions of the electrical activation energy. The amount of modifier material added to the amorphous matrix determines the amount of modification of the localized states and formation of electronic states in the energy gap and the amount of reduction of the electrical activation energy. Thus, the electronic states in the energy gap and the electrical activation energy may also be predetermined and tailored to fit desired electrical characteristics.

What has been stated above in connection with the lone-pair amorphous semiconductor materials also generally applies to the tetrahedral bonding amorphous semiconductor materials and the amorphous semiconductor materials contaning boron. In the primarily tetrahedral bonding amorphous semiconductor materials, the localized states or electrically active centers in the energy gap include, among other, defect electronic configurations, such as, nontetrahedral bonding, and dangling bonds, and, here, the modifier material ineracts with such materials in the amphorous matrix to alter and to form the electronic states or electrically active centers in the energy gap and much of this involves the interaction of the orbitals of the modifier material with the defect electronic configurations and dangling bonds of the amphorous matrix. The transition metals having d orbitals provide particularly fine results when used as the modifier material. Because of the structural configurations of these amorphous semiconductor materials, which include not only one element but a plurality of elements, it is preferable to add the modifier material by codeposition (such as cosputtering) with such amorphous semiconductor materials while the amorphous host matrix is being formed.

In the amphorous semiconductor material containing boron, the localized states or electrically active centers in the energy gap include, among others, three-center bonding, in which two electrons are shared by three atoms in a single covalent bond and yielding nonbonding states which are ordinarily empty and, in a sense, are reversed analogs of lone-pair states. Here, the modifier material ineracts with such semiconductor material in the amorphous matrix to form the electronic states or electrically active centers in the energy gap and much of this involves the interaction of the orbitals of the modifier material with the three-center of other bonding in the amorphous matrix. The transition metals having d orbitals provide particularly fine results when used as the modifier material. Here, it is also preferable to add the modifier material by codeposition (such as cosputtering) with such amorphous semiconductor materials while the amorphous host matrix is being formed. Boron, because of its three-center bonding, can itself be utilized as a modifier material for another host matrix material, such as, silicon.

In accordance with the principles of this invention, the amorphous semiconductor member of this invention may be designed or tailor-made to provide the same with desired physical and electrical properties, as for example, the energy gap (band gap) E(eV) within the design range of 0.40–2.5, the electrical conductivity at room temperature $\sigma_{RT}$ $(\Omega\ \text{cm})^{-1}$ within the design range of $10^{-4}$–$4\times10^{+1}$, the electrical activation energy $E_\sigma$ (eV) within the design range of 0–1.3, the Seeback coefficient S (V/°C.) within the range of $0-\pm2\times10^{-3}$, the conduction type either p or n, with the thermal conductivity about $4\times10^{-3}$. With these wide design ranges many different devices for many different applications of usage may be constructed. By appropriate parameter design of the Seeback coefficient and the electrical conductivity (which should be relatively high), and of the thermal conductivity (which should be relatively low) efficient thermoelectric generation devices may be readily fabricated.

In some of the amorphous semiconductor members of this invention, the addition of the modifier material to the amorphous host matrix does not change the normal conduction type (p or n) thereof, but in others it does change the same to the opposite conduction type, especially where an appreciable amount of modifier material is added. It is, therefore, possible to utilize the principles of this invention to produce p-n junction type devices for current control purposes and the like.

Further objects of this invention reside in the components of the amorphous semiconductor member and the relationships between the components and in the method of making the amorphous semiconductor members.

Other objects and advantages of this invention will become apparent to those skilled in the art upon reference to the accompanying specification, claims, and drawings in which:

FIGS. 1 and 2 are diagrammatic illustrations illustrating diffusion methods for forming the amorphous semiconductor member as illustrated in FIG. 3.

FIG. 3 is a diagrammatic illustration of the amorphous semiconductor member of this invention, whether it is formed by codeposition, ion implantation, or diffusion as in FIGS. 1 and 2.

FIG. 4 is a diagrammatic illustration of a semiconductor device utilizing the amorphous semiconductor member of FIG. 3.

FIG. 5 is a diagrammatic illustration of a further diffusion process for making a thicker amorphous semiconductor member.

FIG. 6 is a diagrammatic illustration of a further form of the device like that of FIG. 4, but having the thicker amorphous semiconductor member, whether it is formed by codeposition, ion implantation, or diffusion as in FIG. 5.

FIGS. 7 and 8 are diagrammatic illustrations of diffusion methods, similar to FIGS. 1 and 2, for forming the amorphous semiconductor member illustrated in FIG. 9.

FIG. 9 is a diagrammatic illustration of another form of the amorphous semiconductor member, whether produced by codeposition, ion implantation, or diffusion as in FIGS. 7 and 8.

FIG. 10 is a diagrammatic illustration of a semiconductor device, utilizing the amorphous semiconductor member of FIG. 9.

FIG. 11 is a diagrammatic illustration of a further diffusion process involved in making a thicker amorphous semiconductor member similar to FIG. 5.

FIG. 12 is a diagrammatic illustration of a further form of the device, like that of FIG. 10, but having a thicker amorphous semiconductor member, whether it is made by codeposition, ion implantation, or diffusion as in FIG. 11.

FIG. 13 is a diagrammatic illustration of a p-n junction type device, utilizing the amorphous semiconductor members of this invention.

FIG. 14 sets forth typical and stylized curves plotting absorption coefficient against energy gap and illustrating the minor differences between the energy gap of the unmodified amorphous semiconductor material and the energy gap of the modified amorphous semiconductor material.

FIG. 15 sets forth a series of typical and stylized curves plotting electrical conductivity against inverse temperature and illustrating the activation energy of the unmodified material and the modified material with various degrees of modification.

Referring first to FIG. 4, one form of a semiconductor device is generally designated at 10. It concludes an amorphous semiconductor member 11, also illustrated in FIG. 3, which is deposited on a substrate 12, preferably formed of an insulating material such as glass or the like. The amorphous semiconductor member 11 includes an amorphous semiconductor material 13 which is formed in a solid amorphous host matrix having structural configurations which have local rather than long-range order, and electronic configurations which have an energy gap and a large electrical activation energy. The amorphous semiconductor member 11 also includes a modifier material 14 which is added to the amorphous matrix and which is substantially homogeneously incorporated in the amorphous semiconductor material 13. The amorphous semiconductor member can also include electrodes 16 and 17 applied thereto for purposes of electrical connections thereto.

Preferably, the amorphous semiconductor member 11 is formed by a codeposition of the amorphous semiconductor material and the modifier material, such as, by co-vacuum deposition, or cosputtering. Cosputtering can be accomplished in a conventional r.f. sputtering system such as made and sold by R.D. Mathis Co. Here, a cathode or target is bonded to a standard aluminum backing plate is made of the semiconductor material to be deposited on the substrate 12. Also, pieces of the modifier material are secured on the semiconductor material of the target. The substrates 12 are carried by a holder located from the target by a distance of about 3.5 cm for a 3½" diameter cathode, and at a distance of about 3 cm for a 1" diameter cathode.

The sputtering machine is first evacuated to a vacuum pressure somewhat less than about $6 \times 10^{-6}$ Torr to provide a background vacuum pressure. Argon is bled into the machine to provide an operating pressure of about $5 \times 10^{-3}$ Torr as determined by a reading on a Pirani vacuum gauge, giving an actual vacuum pressure of about $7 \times 10^{-3}$ Torr in the machine. The surface of the cathode or target and pieces of modifier material are first cleaned by sputtering against the shutter of the machine adjacent to the substrates for about 30 minutes. Thereafter, the shutter is opened and the semiconductor material of the target and the pieces of modifier material on the target are cosputtered onto the substrates. The cathode or target and the holder for the substrates are both water cooled so that the temperatures thereof are low during the sputtering operation. The r.f. power of the machine may have a frequency of about 13.56 MegaHertz, and about 1000 Volts of forward power, about 50-70 watts being utilized for a 3.5" diameter cathode or target.

The deposition rates depend upon the materials being sputtered, and the time of deposition is varied to obtain desired thicknesses of the deposit. The thicknesses of the simultaneously deposited amorphous semiconductor member having the modifier therein may vary from a few 100 Å to about 5μ, depending upon the uses to which the amorphous semiconductor member is to be put. The semiconductor material and the modifier material are deposited on the substrates in amorphous form.

The amount of modifier material substantially homogeneously added to the amorphous semiconductor material in forming the amorphous semiconductor member is generally determined by the area of the pieces of the modifier material applied to the semiconductor material of the cathode or target. Desired percents of modifier material added to the amorphous semiconductor material may accordingly be conveniently controlled. As an example, to obtain an amorphous semiconductor member having a thickness of about 1000 Å and composed of $GE_{33-\frac{1}{3}}Te_{33-\frac{1}{3}}Se_{33-\frac{1}{3}}$ having nickel as a modifier, takes sputtering for about seven minutes from a 3½" cathode, while for a semiconductor material having $Te_{31-\frac{1}{3}}Se_{31-\frac{1}{3}}Ge_{31-\frac{1}{3}}$ and $As_5$, the sputtering takes about three-and-one-half minutes from a 3½" cathode. By utilizing cosputtering as generally here described, the modifier material 14 is substantially homogeneously added to the semiconductor member 11 to provide the beneficial features of this invention, as discussed above.

As an alternative method, the modifier material 14 may be added to the amorphous host matrix containing the amorphous semiconductor material 13 by ion implantation therein. As a further alternative in forming the amorphous semiconductor member, the modifier material 14 may be substantially homogeneously added to the amorphous host matrix containing the amorphous semiconductor material 13 by diffusion, as more particularly shown in FIGS. 1 and 2.

In FIG. 1, a film 13 of amorphous semiconductor material may be deposited on the substrate 12, and then a film of modifier material 14 may be deposited thereon. The modifier material 14 may be diffused into the semiconductor material 13 to arrive at the amorphous semiconductor member 11 illustrated in FIG. 3. Similarly, in FIG. 2, a film 13 of amorphous semiconductor material, a film 14 of modifier material, and then a film 13 of amorphous semiconductor material may be deposited in sequence on the substrate 12 to form a sandwich like construction. Here, the modifier material may be diffused in both directions into the films 13 of amorphous semiconductor material to arrive at the amorphous semiconductor member 11 illustrated in FIG. 3.

The vacuum deposition of the layers 13 and 14 can be accomplished in a conventional vacuum deposition system such as made and sold by Perkin Elmer Company. The semiconductor material to be vacuum deposited is placed in a tungsten boat and the modifier material to be vacuum deposited is placed in another tungsten boat. The substrates 12 upon which the materials are to be deposited are carried by a holder located about 4" above the boats. A shutter is arranged between the boats and the substrates. The boats are individually heated by resistance heaters.

The vaccum deposition machine is evacuated to a vacuum pressure somewhat less than about $5 \times 10^{-5}$ Torr. The boat containing the semiconductor material is heated and the shutter is opened and the semiconductor material is evaporated onto the substrates. A Sloan deposition meter operates to close the shutter and turn off the heater for the semiconductor material to stop the deposition thereof when a desired thickness of deposition is obtained. Thereafter, the boat containing the modifier material is heated and the shutter opened to vacuum deposit the modifier material on the film of semiconductor material previously deposited on the substrates. When a desired thickness of the modifier material is so deposited, the Sloan deposition meter then closes the shutter and turns off the heater for the modifier material.

If a sandwich type deposit is desired, as illustrated in FIG. 2, another layer 13 of semiconductor material is vacuum deposited on the layer 14 of modifier material. In one typical deposition, as illustrated in FIG. 2, the thickness of the semiconductor material layer may be approximately 1000 Å and the thickness of the modifier material layer may be 300 Å. In another typical example, as illustrated in FIG. 2, the thicknesses of each of the layers 13 of the semiconductor material may be 400 Å, and the thickness of the film 14 of the modifier material may be 200 Å.

After the depositions are completed, the structures of FIGS. 1 and 2 are placed on a hot plate at about 210° C. for a period of time ranging from one minute to one hour which causes the modifier material of layer 14 to diffuse into the semiconductor material of layer or layers 13 to provide the amorphous semiconductor member 11 illustrated in FIG. 3. The layer or layers 13 of the semiconductor material are deposited in amorphous form as is the modifier material layer 14 so that the resultant structure illustrated in FIG. 3 is an amorphous member 11 comprising the amorphous semiconductor material 13 with the amorphous modifier material 14 substantially homogeneously diffused therein.

As shown in FIG. 4, the electrodes 16 and 17 are placed in spaced apart points along the amorphous semiconductor member 11 so as to be subject to the electrical characteristics along the length of the semiconductor member 11. As for example, the device 10 of FIG. 4 can be a thermoelectric generator device so that when one end of the device is heated to have a higher temperature than the other end thereof, thermoelectric power is developed in the semiconductor member with the power being taken off at the spaced electrodes 16 and 17.

Another form of the invention is designated at 10A in FIG. 10 and it differs from the device 10 of FIG. 4 in that the electrodes 16 and 17 are on opposite sides of the amorphous semiconductor member 11 so as to respond to the electrical characteristics of the amorphous semiconductor member 11 through the thickness thereof as distinguished from through the length thereof. In this connection, as shown in FIG. 9, a metallic electrode 16 is first deposited on the substrate 12 before the amorphous semiconductor member 11 is deposited. The amorphous semiconductor member 11, including the amorphous semiconductor matrix 13 with the modifier material 14 homogeneously added thereto, may be formed and deposited in the same manner as the amorphous semiconductor member 11 of FIG. 3. The amorphous semiconductor member 11 may be formed by cosputtering as discussed above or by diffusion as discussed above, and as illustrated in FIGS. 7 and 8 which correspond to FIGS. 1 and 2.

After the amorphous semiconductor member 11 is formed, as in FIG. 9, a metal electrode 17 is deposited thereover as illustrated in FIG. 10. As one example, the amorphous semiconductor device 10A of FIG. 10 may be utilized as a thermoelectric generator device by heating the electrode 17 to a temperature above that of the electrode 16 for generating thermoelectric power in the amorphous semiconductor member 11 thereacross, the electrodes 16 and 17 being utilized for taking off the thermoelectric power. As another example, the metal electrode 17 may be a transparent metal so as to pass light therethrough. The transparent electrode 17 is such with respect to the semiconductor member as to provide a Schottky barrier between it and the semiconductor member 11. Light, such as solar energy, generates photoelectrically, at the Schottky barrier, voltage and current which can be taken off by the electrodes 16 and 17.

FIGS. 6 and 12 disclose amorphous semiconductor devices 20 and 20A, similar to those designated at 10 and 10A in FIGS. 4 and 10, respectively. The devices 20 and 20A differ from the devices 10 and 10A in that the devices 20 and 20A are considerably thicker than the devices 10 and 10A. The thick amorphous semiconductor members 11 of the devices 20 and 20A can be obtained by increasing the length of time of cosputtering of the amorphous semiconductor material and the modifier material as described above. The thicker amorphous semiconductor member 11 of the devices 20 and 20A can also be obtained by the diffusion method discussed above. Here, additional layers 14 of modifier material and layers 13 of semiconductor material may be deposited, and may utilize many of such layers. This is illustrated by way of example in FIGS. 5 and 11. The modifier material of the layers 14 are diffused into the amorphous semiconductor layers 13 in accordance with the diffusion process discussed above.

The amorphous semiconductor members 11 may be of the p or n conduction types and, as illustrated in FIG. 13, a device generally designated at 22 includes two layers of amorphous semiconductor members 11, one of which is p type and the other of which is n type. These two layers 11 form between them a p-n junction designated at 23. The device 22, therefore, comprises a p-n junction type device for current controlling purposes, or the like.

The typiecal and stylized curves of FIG. 15 graphically point up one of the major features of this invention, the curves plotting electrical conductivity $\sigma[\Omega\text{cm}]^{-1}$ against inverse temperature $1000/T[^\circ\text{k}]^{-1}$. The unmodified amorphous semiconductor material in the amorphous host matrix has electrical configurations which have an energy gap $E_{04}$ and a large electrical activation energy $E_\sigma$ and a large electrical activation energy $E_\sigma$ and since such unmodified material is intrinsic, its electrical activation energy $E_\sigma$ is substantially one-half the energy gap $E_{04}$. Here, the energy gap is 1.5 and the electrical activation energy $E_\sigma$ is 0.75 eV as shown by curve 35. When modifier material is added to the amorphous semiconductor material, the intrinsic unmodified semiconductor material is converted or changed at will to an extrinsic material to stable extrinsic levels as shown by the dotted curves 36 in FIG. 15 depending upon the amount of addition of the modifier material, with a corresponding decrease in electrical activation energy $E_\sigma$ until an electrical activation energy $E_\sigma$ of 0.02eV is reached as indicated by the curve 37 in FIG. 15. With these stable extrinsic levels, the electrical conductivity at room temperature (and above) $\sigma_{RT}[\Omega cm]^{-1}$ is correspondingly increased as shown by the intersection of the room temperature line 38 with the curves 35, 36, and 37 in FIG. 15. Thus, the unmodified amorphous semiconductor material, which is basically intrinsic, by the addition of selected amounts of modifier material, can be converted at will to a material, which is basically extrinsic, and having stable extrinsic levels at room temperature and above having desired electrical activation energies $E_\sigma$ which are decreased and desired electrical conductivities $\sigma_{RT}$ which are increased in accordance with the amount of modifier material added to the amorphous semiconductor material. A wide design range of activation energy and electrical conductivity can be engineered into the amorphous semiconductor member to meet desired electrical parameters.

The typical and stylized curves of FIG. 14 graphically point up another of the major features of this invention, the curves plotting absorption coefficient log $\alpha[cm]^{-1}$ against energy gap E [eV]. The energy gap $E_{04}$ equals the energy at which the absorption coefficient $\alpha$ of the amorphous semiconductor member is $10^4[cm]^{-1}$. For the unmodified semiconductor material as considered in connection with curve 35 of FIG. 15, the energy gap $E_{04}$ is substantially, 1.50 eV, as shown by curve 39 of FIG. 14, and for a modified semiconductor material as considered in connection with curve 37 of FIG. 15, the energy gap $E_{04}$ is substantially 1.45 eV, as shown by the curve 40 of FIG. 14. Thus, it is seen that there is very little difference in the energy gaps $E_{04}$ between the unmodified semiconductor material and the modified material even though there is considerable difference between the activation energies $E_\sigma$ and the electrical conductivity $\sigma_{RT}$ thereof. This is probably due to the fact that the addition of the modifier material to the amorphous semiconductor material has little effect upon the structural configurations of the amorphous semiconductor matrix and the energy gap of the electrical configurations thereof. Thus, while a wide design range of activation energy and electrical conductivity can be engineered into the amorphous semiconductor member, this can be done without materially changing the structural configurations and the energy gap of the amorphous semiconductor material, which is important in connection with preserving the physical properties thereof, including thermal and optical properties. In some instances of the amorphous semiconductor member of this invention, the curves 39 and 40 of FIG. 14 may deviate considerably from those shown but this is unimportant if there is no need for preserving the physical properties of the unmodified semiconductor material.

As stated above, there is a wide design range for the structural configurations and the energy (band gap) E(eV) of the amorphous semiconductor members and this can be brought about by appropriate selection of the amorphous semiconductor materials. As an example, the following amorphous semiconductor materials can have approximately the following energy gaps E(eV): Se—2.5; GeSe—2.2; $Te_{33-\frac{1}{3}}Se_{33-\frac{1}{3}}Ge_{33-\frac{1}{3}}$—1.5; $Te_{31-\frac{1}{3}}Se_{31-\frac{1}{3}}Ge_{31-\frac{1}{3}}As_5$—1.4; $As_{9.9}Te_1$—1.2; $Ge_{80}Te_{20}$—0.5; Si—1.5; SiC—2.06; $B_4C$—3.0; As—1.2, and the like. These amorphous semiconductors can also be modified with modifier materials to provide extrinsic conduction and desired activation energies $E_\sigma$ and electrical conductivities at room temperature (and above)$\sigma_{RT}$.

The following are some illustrative examples of the amorphous semiconductor members of this invention utilizing various amorphous semiconductor materials and various modifier materials added thereto and setting forth available information with respect to physical and electrical properties thereof, including energy gap (band gap) E(eV), electrical conductivity at room temperature $\sigma_{RT}(\Omega cm)^{-1}$, electrical activation energy, $E_\sigma$ (eV), Seeback coefficient, S(V/°C.), and conduction type p or n.

I. Amorphous semiconductor material of $Te_{31-\frac{1}{3}}Se_{31-\frac{1}{3}}Ge_{31-\frac{1}{3}}As_5$, hereinafter referred to as [1562], and added modifier material of Ni. Here, the amorphous semiconductor material and the modifier material are cosputtered as discussed above to provide the amorphous semiconductor member, including the amorphous host matrix and the added modifier material, with the following properties.

|  | $E_{04}$ | $\sigma_{RT}$ | $E_\sigma$ | S | Type |
|---|---|---|---|---|---|
| [1562] | 1.42 | $5 \times 10^{-10}$ | 0.7 | +3100 | p |
| + 1.2% Ni | 1.22 | $3 \times 10^{-5}$ | .26-.07 | +300 | p |
| + 3.6% Ni | 1.22 | $8 \times 10^{-4}$ | .22-.08 | −82 | n |
| + 7% Ni | 1.12 | $4 \times 10^{-2}$ | .13-.05 | −84 | n |

It is here noted that with increasing amounts of added nickel, the energy gap does not decrease appreciably, the electrical conductivity increases substantially, the activation energy decreases substantially, the Seebeck coefficient changes, and the conduction type changes from p to n with the addition of at least a certain percentage of nickel.

II. Amorphous semiconductor material of [1562] as set forth above in connection with example I and added modifier material of Fe. The amorphous semiconductor material and the modifier material are cosputtered as discussed above to provide the amorphous semiconductor member, including the amorphous host matrix and the added modifier material, with the following properties.

|  | $E_{04}$ | $\sigma_{RT}$ | $E_\sigma$ | S | Type |
|---|---|---|---|---|---|
| [1562] | 1.4 | $2 \times 10^{-8}$ | 0.55 | +3100 | p |
| + 5% Fe | 1.46 | $1.8 \times 10^{-5}$ | 0.20 | +20 | p |

It is noted that the energy gap does not change appreciably, the electrical conductivity increases substantially, the activation energy decreases substantially, the Seebeck coefficient changes substantially, and the conductivity type remains the same, although it is possible that with the addition of additional iron the conductivity type may change from p to n.

III. Amorphous semiconductor material of [1562] as discussed above in connection with example I and added modifier material of V. The amorphous semiconductor material and the modifier material are cosputtered as discussed above to provide the amorphous semiconductor member, including the amorphous host matrix and the added modifier material, with the following properties.

|  | $E_{04}$ | $\sigma_{RT}$ | $E_\sigma$ | S | Type |
|---|---|---|---|---|---|
| [1562] | 1.4 | $2 \times 10^{-8}$ | 0.55 | +3100 | p |
| + 6% V | 1.52 | $2 \times 10^{-8}$ | 0.37 | +266 | p |

It is noted that the energy gap does not change appreciably, while the electrical conductivity remains about the same, the activation energy decreases substantially, the Seebeck coefficient changes substantially, and the conductivity type remains the same. It is believed that the addition of more vanadium may change the conductivity type from p to n.

IV. Amorphous semiconductor material of [1562] as discussed above in connection with example I and added modifier material of Cu. The amorphous semiconductor material and the modifier material are cosputtered as discussed above to provide the amorphous semiconductor member, including the amorphous host matrix and the added modifier material, with the following properties.

|  | $E_{04}$ | $\sigma_{RT}$ | $E_\sigma$ | S | Type |
|---|---|---|---|---|---|
| [1562] | 1.4 | $2 \times 10^{-8}$ | 0.55 | +3100 | p |
| + 4% Cu |  | $9 \times 10^{-9}$ | 0.5 | −6000 | n |

It is noted that the electrical conductivity and the activation energy do not change appreciably. This may be due to the d-orbitals of atomic copper being full. However, the Seebeck coefficient changes substantially and the conductivity type changes from p to n.

V. Amorphous semiconductor material of [1562] and added modifier material of Zn. The amorphous semiconductor material and the modifier material are cosputtered as discussed above to provide the amorphous semiconductor member, including the amorphous host matrix and the added modifier material, with the following properties.

|  | $E_{04}$ | $\sigma_{RT}$ | $E_\sigma$ | S | Type |
|---|---|---|---|---|---|
| [1562] | 1.4 | $2 \times 10^{-8}$ | 0.55 | +3100 | p |
| + 5% Zn | 1.58 | $1.3 \times 10^{-9}$ | 0.71 | −520 | n |

It is noted that there is relatively small change in the energy gap, the electrical conductivity and the activation energy. This may be due to the d-orbitals of atomic zinc being full. There is considerable change in the Seebeck coefficient and the conductivity type changes from p to n.

VI. Amorphous semiconductor material of $Te_{33-\frac{1}{3}}Se_{33-\frac{1}{3}}Ge_{33-\frac{1}{3}}$, hereinafter referred to as [2208], and added modifier material of Mo. The amorphous semiconductor material and the modifier material are cosputtered as discussed above to provide the amorphous semiconductor member, including the amorphous host matrix and the added modifier material, with the following properties.

|  | $E_{04}$ | $\sigma_{RT}$ | $E_\sigma$ | S | Type |
|---|---|---|---|---|---|
| [2208] | 1.5 | $10^{-8}$ | 0.52 | 1000 | p |
| + 1% Mo | 1.24 | $2 \times 10^{-6}$ | 0.455 | 100 | p |
| + 8% Mo | 1.24 | $5 \times 10^{-4}$ | 0.354 | 13.6 | p |

It is noted that the energy gap does not decrease appreciably, the electrical conductivity increases appreciably, the activation energy decreases somewhat, the Seebeck coefficient changes substantially, and the conductivity type remains p.

VII. Amorphous semiconductor material of [2208] as discussed above in connection with example VI and added modifier material of Rh. The amorphous semiconductor material and the modifier material are cosputtered as discussed above to provide the amorphous semiconductor member, including the amorphous host matrix and the added modifier material, with the following properties after annealing.

|  | $E_{04}$ | $\sigma_{RT}$ | $E_\sigma$ | S | Type |
|---|---|---|---|---|---|
| [2208] | 1.5 | $10^{-10}$ | 0.79 | 1000 | p |
| + 6% Rh | 1.59 | $1 \times 10^{-9}$ | 0.68 | 5000 | p |

It is noted that the energy gap is not decreased, the electrical conductivity is increased, and the activation energy is decreased. The Seebeck coefficient is increased substantially and the conductivity type remains p.

VIII. Amorphous semiconductor material of [2208] discussed above in connection with example VI and added modifier material of In. Here, the amorphous semiconductor material is first formed into the amorphous host matrix and the modifier material is diffused into the amorphous host matrix as discussed above to provide the amorphous semiconductor member, including the amorphous host matrix and the added modifier material. Here, a sandwich construction as illustrated in FIG. 2 is utilized wherein the layer of modified material comprising substantially 25% of the amorphous semiconductor material, and the layer of the modified material is diffused by thermal diffusion into the adjacent layers of the amorphous semiconductor material. Different thicknesses of the modifier material and the thicknesses of the semiconductor materials determine the amount of modifier material added to the semiconductor material, this being represented by the following tabulation:

|  | $E_{04}$ | $\sigma_{RT}$ | $E_\sigma$ | S | Type |
|---|---|---|---|---|---|
| [2208] | 1.5 | $10^{-10}$ | 0.7 | +1000 | p |
| 400A + 50A In | 1.5 | $10^{-9}$ | 0.2 |  |  |
| 800A + 100A In | 1.5 | $2 \times 10^{-8}$ | 0.15 |  |  |
| 1200A + 150A In | 1.5 | $2.5 \times 10^{-7}$ | 0.07 | +200 | p |
| 1600A + 200A In | 1.5 | $8 \times 10^{-6}$ | 0.06 | +160 | p |
| 2400A + 300A In | 1.5 | $2 \times 10^{-4}$ | 0.04 |  |  |
| 4000A + 500A In | 1.5 | $10^{-3}$ | 0.02 |  |  |

It is noted that with increasing amounts of added indium the energy gap remains substantially the same, the electrical conductivity increases substantially, the activation energy decreases substantially, the Seebeck coefficient changes substantially and the conductivity type remains p.

IX. Amorphous semiconductor material of As and added modifier material of Ni. The amorphous semiconductor material and the modifier material are cosputtered as discussed above to provide the amorphous semiconductor member, including the amorphous host matrix and the added modifier material, with the following properties.

|  | $E_{04}$ | $\sigma_{RT}$ | $E_\sigma$ | S | Type |
|---|---|---|---|---|---|
| As | 1.2 | $10^{-7}$ | 0.7 | −1500 | n |
| + 4% Ni | 1.2 | $3 \times 10^0$ | 0.063 | −50 | n |

It is noted that the energy gap remains substantially the same, the electrical conductivity increases substantially, the activation energy decreases substantially, the Seebeck coefficient changes substantially, and the conductivity type remains n.

X. Amorphous semiconductor material of Si and added modifier material of Ni. Here, the amorphous semiconductor material and the modifier material are cosputtered as discussed above to provide the amorphous semiconductor member, including the amorphous host matrix and the added modifier material, with the following properties.

|  | $E_{04}$ | $\sigma_{RT}$ | $E_\sigma$ | S | Type |
|---|---|---|---|---|---|
| Si | 1.5 | $10^{-7}$ | 0.33 | −2000 | n |
| + 4% Ni | 1.2 | $2.5 \times 10^{-1}$ | 0.05 | −2 | n |
| + 7% Ni |  | $10^0$ | 0.046 | −2 | n |

It is here noted that the energy gap does not change appreciably, the conductivity increases substantially, the activation energy decreases substantially, the Seebeck coefficient changes substantially, and the conductivity type remains n.

XI. Amorphous semiconductor material of Si and the added modifier material of B. Here, the amorphous semiconductor material and the modifier material are cosputtered as discussed above to provide the amorphous semiconductor member, including the amorphous host matrix and the added modifier material, with the following properties.

|  | $E_{04}$ | $\sigma_{RT}$ | $E_\sigma$ | S | Type |
|---|---|---|---|---|---|
| Si | 1.5 | $10^{-7}$ | 0.33 | −2000 | n |
| + 2.5% B | 1.35 | $2 \times 10^{-3}$ | 0.21 | +740 | p |

It is noted that the energy gap does not change appreciably, the electrical conductivity increases substantially, the activation energy decreases substantially, the Seebeck coefficient changes substantially and the conductivity type changes from n to p.

XII. Amorphous semiconductor material of SiC and the added modifier material of W. Here, the amorphous semiconductor material and the modifier material are cosputtered as discussed above to provide the amorphous semiconductor member, including the amorphous host matrix and the added modifier material, with the following properties.

|  | $E_{04}$ | $\sigma_{RT}$ | $E_\sigma$ | S | Type |
|---|---|---|---|---|---|
| SiC | 2.06 | $10^{-4}$ | 0.19 | +100 | p |
| + 0.06% W | 2.0 | $2 \times 10^{-4}$ | 0.20 | +100 | p |
| + 0.2% W | 2.0 | $7 \times 10^{-4}$ | 0.19 | +74 | p |

-continued

|  | $E_{04}$ | $\sigma_{RT}$ | $E_\sigma$ | S | Type |
|---|---|---|---|---|---|
| + 1.0% W | 1.8 | $2 \times 10^{-3}$ | 0.19 | +50 | p |
| + 4% W | 1.65 | $3 \times 10^{-1}$ | 0.132 | +22 | p |
| + 10% W | 1.0 | $10^{-1}$ | 0.05 | +8 | p |

It is noted that the energy gap does not decrease appreciably until a substantial amount of tungsten is added, the electrical conductivity increases substantially, the activation energy does not increase substantially until a substantial amount of tungsten is added, the Seebeck coefficient changes substantially and the conductivity type remains p.

XIII. Amorphous semiconductor material of B₄C and added modifier material of W. The amorphous semiconductor material and the modifier material are cosputtered as discussed above to provide the amorphous semiconductor member, including the amorphous host matrix and the added modifier material, with the following properties.

|  | $E_{04}$ | $\sigma_{RT}$ | $E_\sigma$ | S | Type |
|---|---|---|---|---|---|
| B₄C | 3.0 | $10^{-6}$ | 0.2 | +500 | p |
| + 7% W | 2.43 | $7 \times 10^{-1}$ | 0.04 | +36 | p |

It is noted that the energy gap does not decrease appreciably, the electrical conductivity increases substantially, the activation energy decreases substantially, the Seebeck coefficient changes substantially and the conductivity type remains p.

In view of the foregoing illustrative examples, it is seen that the amorphous semiconductor members of this invention can be readily designed or tailor-made to provide the same with desired physical and electrical properties for the fabrication of many different devices for many different applications of usage. Substitutional doping is made possible in tetrahedral materials by providing almost all of the nearest-neighbor sites local environments of the tetrahedral type. This is true in both the crystalline material and the glow discharge amorphous silicon. The present invention allows for far more nearest-neighbor bonding choices. This is a more normal result of amorphicity. The great number of these varied orbital and bonding relationships make irrelevant the substitution of one atom into a regularly spaced matrix. What is required is to take into account the multibonding possibilities and utilize them by modification to control conductivity. Not only is boron a good example of the multiorbital possibilities in the amorphous phase, but also the carbon atom, just as it does in organic materials, offers these multiorbital interactions with other inorganic materials. Therefore, it is the nonprimary bonding which is the important aspect of this invention. Not only are the Groups III, IV, V and VI important, but the top row, such as boron and carbon, can also be important as bond matrices and modifiers by virtue of the differing bonding possibilities they offer.

While for purposes of illustration several forms of this invention have been disclosed, other forms thereof may become apparent to those skilled in the art upon reference to this disclosure, and, therefore, this invention is to be limited only by the scope of the appended claims.

The claims:

1. An amorphous semiconductor member comprising a primarily lone-pair amorphous semiconductor material having orbitals formed in a solid amorphous host matrix having structural configurations which have local rather than long-range order and electronic configurations providing an energy gap and a large electrical activation energy, and a modifier material added to said amorphous host matrix and having orbitals which interact with the orbitals of the amorphous host matrix and form electronic states in the energy gap which modify substantially the electronic configurations of the amorphous host matrix for reducing substantially the electrical activation energy thereof and, hence, increasing substantially the electrical conductivity of the semiconductor member at room temperature and above, the amount of addition of the modifier material controlling the range of electrical conductivity.

2. The amorphous semiconductor member as defined in claim 1 wherein said amorphous host matrix also initially had localized states within its energy gap, and said modifier material also deactivated at least some of said localized states as well as forming said electronic states.

3. The amorphous semiconductor member as defined in claim 1 wherein the amorphous semiconductor material forming the solid amorphous host matrix has various bonding options for the same semiconductor material.

4. The amorphous semiconductor member as defined in claim 1 wherein the solid amorphous semiconductor material in the amorphous matrix can be designed to provide substantially any desired energy gap therein.

5. The amorphous semiconductor member as defined in claim 1 wherein the modifier material added to the amorphous host matrix has substantially no effect on the energy gap thereof.

6. The amorphous semiconductor member as defined in claim 1 wherein the modifier material added to the amorphous host matrix has some effect on the energy gap thereof.

7. The amorphous semiconductor member as defined in claim 1 wherein said modifier material was added to said amorphous host matrix at temperatures below the melting point temperature of the amorphous host matrix.

8. The amorphous semiconductor member as defined in claim 1 wherein said modifier material was added to said amorphous host matrix at temperatures below the glass transition temperature of the amorphous host matrix.

9. The amorphous semiconductor member as defined in claim 1 wherein the amount of said modifier material added to said amorphous host matrix can be greater than dopant amounts usually used for doping semiconductor materials.

10. The amorphous semiconductor member as defined in claim 1 wherein said modifier material added to said amorphous host matrix is at least in part bonded to said amorphous matrix.

11. The amorphous semiconductor member as defined in claim 10 wherein at least some of the bonding includes dative or coordinate bonding.

12. The amorphous semiconductor member as defined in claim 1 wherein said modifier material added to said amorphous host matrix is at least in part not bonded to said amorphous matrix.

13. The amorphous semiconductor member as defined in claim 1 wherein the amorphous host matrix of the amorphous semiconductor material is normally of intrinsic-like conduction and the modifier material added to the amorphous host matrix changes the same to extrinsic-like conduction.

14. The amorphous semiconductor member as defined in claim 1 wherein the amorphous host matrix of the amorphous semiconductor material is normally of one conduction type (p or n) and the modifier material added to the amorphous host matrix changes the same to the opposite conduction type.

15. The amorphous semiconductor member as defined in claim 1 wherein the amorphous host matrix of the amorphous semiconductor material is normally of one conduction type (p or n) and the modifier material added to the amorphous host matrix does not change the conduction type thereof.

16. The amorphous semiconductor member as defined in claim 1 wherein the amorphous semiconductor material comprises one or more elements selected from Groups V and VI of the periodic table.

17. The amorphous semiconductor member as defined in claim 1 wherein the amorphous semiconductor material includes tellurium, selenium, and/or sulphur.

18. The amorphous semiconductor member as defined in claim 1 wherein the amorphous semiconductor material includes germanium, and/or arsenic.

19. The amorphous semiconductor member as defined in claim 1 wherein the modifier material comprises elements selected from Groups I, II, and III of the periodic table.

20. The amorphous semiconductor member as defined in claim 1 wherein the modifier material includes a transition metal.

21. The amorphous semiconductor member as defined in claim 1 wherein the modifier material includes a rare-earth element.

22. The amorphous semiconductor member as defined in claim 1 wherein the modifier material includes indium, gallium, or aluminum.

23. The amorphous semiconductor member as defined in claim 1 wherein the modifier material includes nickel, tungsten, vanadium, molybdenum, rhodium or iron.

24. An amorphous semiconductor member comprising a primarily tetrahedral bonding amorphous semiconductor material formed in a solid amorphous host matrix having structural configurations which have local rather than long-range order and electronic configurations providing an energy gap and a large electrical activation energy, and a modifier material added to said amorphous host matrix, primarily in a non-substitutional manner and can be in amounts greater than dopant amounts, and having orbitals which interact with the amorphous host matrix and form electronic states in the energy gap which modify substantially the electronic configurations of the amorphous host matrix for reducing substantially the activation energy and, hence, increasing substantially the electrical conductivity of the semiconductor member at room temperature and above, the amount of addition of the modifier material controlling the range of electrical conductivity.

25. The amorphous semiconductor member as defined in claim 24 wherein said amorphous host matrix also initially had localized states within its energy gap, and said modifier material also deactivated at least some of said localized states as well as forming said electronic states.

26. The amorphous semiconductor member as defined in claim 24 wherein the amorphous semiconductor material forming the solid amorphous host matrix has various bonding options for the same semiconductor material.

27. The amorphous semiconductor member as defined in claim 24 wherein said amorphous semiconductor material comprises a plurality of elements bonded in the amorphous host matrix.

28. The amorphous semiconductor member as defined in claim 24 wherein the solid amorphous semiconductor material in the amorphous matrix can be designed to provide substantially any desired energy gap therein.

29. The amorphous semiconductor member as defined in claim 24 wherein the modifier material added to the amorphous host matrix has substantially no effect on the energy gap thereof.

30. The amorphous semiconductor member as defined in claim 24 wherein the modifier material added to the amorphous host matrix has some effect on the energy gap thereof.

31. The amorphous semiconductor member as defined in claim 24 wherein said modifier material was added to said amorphous host matrix at temperatures below the melting point temperature of the amorphous host matrix.

32. The amorphous semiconductor member as defined in claim 24 wherein said modifier material added to said amorphous host matrix is at least in part bonded to said amorphous matrix.

33. The amorphous semiconductor member as defined in claim 32 wherein at least some of the bonding includes dative or coordinate bonding.

34. The amorphous semiconductor member as defined in claim 24 wherein said modifier material added to said amorphous host matrix is at least in part not bonded to said amorphous matrix.

35. The amorphous semiconductor member as defined in claim 24 wherein the amorphous host matrix of the amorphous semiconductor material is normally of intrinsic-like conduction and the modifier material added to the amorphous host matrix changes the same to extrinsic-like conduction.

36. The amorphous semiconductor member as defined in claim 24 wherein the amorphous host matrix of the amorphous semiconductor material is normally of one conduction type (p or n) and the modifier material added to the amorphous host matrix changes the same to the opposite conduction type.

37. The amorphous semiconductor member as defined in claim 24 wherein the amorphous host matrix of the amorphous semiconductor material is normally of one conduction type (p or n) and the modifier material added to the amorphous host matrix does not change the conduction type thereof.

38. The amorphous semiconductor member as defined in claim 24 wherein the amorphous semiconductor material comprises one or more elements selected from Group IV of the periodic table.

39. The amorphous semiconductor member as defined in claim 24 wherein the amorphous semiconductor material includes silicon, and/or carbon.

40. The amorphous semiconductor member as defined in claim 24 wherein the amorphous semiconductor material comprises elements selected from Groups III and V or from Groups II and VI of the periodic table.

41. The amorphous semiconductor member as defined in claim 24 wherein the modifier material includes a transition metal.

42. The amorphous semiconductor member as defined in claim 24 wherein the modifier material includes a rare-earth element.

43. The amorphous semiconductor member as defined in claim 24 wherein the modifier material includes nickel, tungsten, or boron added by cosputtering.

44. An amorphous semiconductor member comprising an amorphous semiconductor material containing boron formed in a solid amorphous host matrix having structural configurations which have local rather than long-range order and electronic configurations providing an energy gap and a large electrical activation energy, and a modifier material added to said amorphous host matrix and having orbitals which interact with the amorphous host matrix and form electronic states in the energy gap which modify substantially the electronic configurations of the amorphous host matrix for reducing substantially the electrical activation energy thereof and, hence, increasing substantially the electrical conductivity of the semiconductor member at room temperature and above, the amount of addition of the modifier material controlling the range of electrical conductivity.

45. The amorphous semiconductor member as defined in claim 44 wherein said amorphous host matrix also initially had localized states within its energy gap, and said modifier material also deactivated at least some of said localized states as well as forming said electronic states.

46. The amorphous semiconductor member as defined in claim 44 wherein the amorphous semiconductor material forming the solid amorphous host matrix has various bonding options for the same semiconductor material.

47. The amorphous semiconductor member as defined in claim 44 wherein the modifier material added to the amorphous host matrix has substantially no effect on the energy gap thereof.

48. The amorphous semiconductor member as defined in claim 44 wherein the modifier material added to the amorphous host matrix has some effect on the energy gap thereof.

49. The amorphous semiconductor member as defined in claim 44 wherein said modifier material was added to said amorphous host matrix at temperatures below the melting point temperature of the amorphous host matrix.

50. The amorphous semiconductor member as defined in claim 44 wherein the amount of said modifier material added to said amorphous host matrix can be greater than dopant amounts usually used for doping semiconductor materials.

51. The amorphous semiconductor member as defined in claim 44 wherein said modifier material added to said amorphous host matrix is at least in part bonded to said amorphous matrix.

52. The amorphous semiconductor member as defined in claim 44 wherein said modifier material added to said amorphous host matrix is at least in part not bonded to said amorphous matrix.

53. The amorphous semiconductor member as defined in claim 44 wherein the amorphous host matrix of the amorphous semiconductor material is normally of intrinsic-like conduction and the modifier added to the amorphous host matrix changes the same to extrinsic-like conduction.

54. The amorphous semiconductor member as defined in claim 44 wherein the amorphous host matrix of the amorphous semiconductor material is normally of one conduction type (p or n) and the modifier material added to the amorphous host matrix changes the same to the opposite conduction type.

55. The amorphous semiconductor member as defined in claim 44 wherein the amorphous host matrix of the amorphous semiconductor material is normally of one conduction type (p or n) and the modifier material added to the amorphous host matrix does not change the conduction type thereof.

56. The amorphous semiconductor member as defined in claim 44 wherein the amorphous semiconductor material also includes carbon.

57. The amorphous semiconductor member as defined in claim 44 wherein the modifier material includes a transition metal.

58. The amorphous semiconductor member as defined in claim 44 wherein the modifier material includes a rare-earth element.

59. The amorphous semiconductor member as defined in claim 44 wherein the modifier material includes tungsten.

60. The method of making an amorphous semiconductor member comprising forming a primarily lone-pair amorphous semiconductor material having orbitals in a solid amorphous host matrix having structural configurations which have local rather than long-range order and electronic configurations providing an energy gap and a large electrical activation energy, and adding to said amorphous host matrix a modifier material having orbitals which interact with the orbitals of the amorphous host matrix and form electronic states in the energy gap which modify substantially the electronic configurations of the amorphous host matrix for reducing substantially the electrical activation energy thereof and, hence, increasing substantially the electrical conductivity of the semiconductor member at room temperature and above, the amount of addition of the modifier material controlling the range of electrical conductivity.

61. The method as defined in claim 60 wherein said modifier material is added to said amorphous host matrix at temperatures below the melting point temperature of the amorphous host matrix.

62. The method as defined in claim 60 wherein said modifier material is added to said amorphous host matrix at temperatures below the glass transition temperature of the amorphous host matrix.

63. The method as defined in claim 60 wherein the amount of said modifier material added to said amorphous host matrix can be greater than dopant amounts usually used for doping semiconductor materials.

64. The method of making an amorphous semiconductor member comprising forming a primarily tetrahedral bonding amorphous semiconductor material in a solid amorphous host matrix having structural configurations which have local rather than long-range order and electronic configurations providing an energy gap and a large electrical activation energy, and adding to said amorphous host matrix, primarily in a non-substitutional manner and can be in amounts greater than dopant amounts, a modifier material having orbitals which interact with the amorphous host matrix and form electronic states in the energy gap which modify substantially the electronic configurations of the amorphous host matrix for reducing substantially the electrical activation energy thereof and, hence, increasing substantially the electrical conductivity of the semiconductor member at room temperature and above, the amount of addition of the modifier material controlling the range of electrical conductivity.

65. The method as defined in claim 64 wherein said modifier material is added to said amorphous host matrix at temperatures below the melting point temperature of the amorphous host matrix.

66. The method of making an amorphous semiconductor member comprising forming an amorphous semiconductor material containing boron in a solid amorphous host matrix having structural configurations which have local rather than long-range order and electronic configurations providing an energy gap and a large electrical activation energy, and adding to said amorphous host matrix a modifier material having orbitals which interact with the amorphous host matrix and form electronic states in the energy gap which modify substantially the electronic configurations of the amorphous host matrix for reducing substantially the electrical activation energy thereof and, hence, increasing substantially the electrical conductivity of the semiconductor member at room temperature and above, the amount of addition of the modifier material controlling the range of electrical conductivity.

67. The method as defined in claim 66 wherein said modifier material is added to said amorphous host matrix at temperatures below the melting point temperature of the amorphous host matrix.

68. The method as defined in claim 66 wherein the amount of said modifier material added to said amorphous host matrix can be greater than dopant amounts usually used for doping semiconductor materials.

69. An amorphous semiconductor member comprising a primarily lone-pair amorphous semiconductor material having orbitals formed in a solid amorphous host matrix having structural configurations which have local rather than long-range order and electronic configurations providing an energy gap and an electrical activation energy, and a modifier material added to said amorphous host matrix and having orbitals which interact with the orbitals of the amorphous host matrix and form electronic states in the energy gap which modify substantially the electronic configurations of the amorphous host matrix for changing substantially the Seebeck coefficient thereof and/or the conductivity type thereof.

70. The amorphous semiconductor member as defined in claim 69 wherein the modifier material includes a transition metal.

71. The amorphous semiconductor member as defined in claim 69 wherein the modifier material includes nickel, copper and zinc.

72. An amorphous semiconductor member comprising a primarily tetrahedral bonding amorphous semiconductor material formed in a solid amorphous host matrix having structural configurations which have local rather than long-range order and electronic configurations providing an energy gap and an electrical activation energy, and a modifier material added to said amorphous host matrix, primarily in a nonsubstitutional manner and can be in amounts greater than dopant amounts, and having orbitals which interact with the amorphous host matrix and form electronic states in the energy gap which modify substantially the electronic configurations of the amorphous host matrix for changing substantially the Seebeck coefficient thereof and/or the conductivity type thereof.

73. The amorphous semiconductor member as defined in claim 72 wherein the modifier material includes a transition metal.

74. The amorphous semiconductor member as defined in claim 72 wherein the modifier material includes boron added by cosputtering.

75. An amorphous semiconductor member comprising an amorphous semiconductor material containing boron formed in a solid amorphous host matrix having structural configurations which have local rather than long-range order and electronic configurations providing an energy gap and an electrical activation energy,
   and a modifier material added to said amorphous host matrix and having orbitals which interact with the amorphous host matrix and form electronic states in the energy gap which modify substantially the electronic configurations of the amorphous host matrix for changing substantially the Seebeck coefficient thereof.

76. The amorphous semiconductor member as defined in claim 75 wherein the modifier material includes a transition metal.

77. The amorphous semiconductor member as defined in claim 1 wherein the amorphous semiconductor material includes tellurium, selenium and germanium.

78. The amorphous semiconductor member as defined in claim 1 wherein the amorphous semiconductor material includes arsenic.

79. The amorphous semiconductor member as defined in claim 1 wherein the amorphous semiconductor material comprises tellurium, selenium, germanium and arsenic.

80. The amorphous semiconductor member as defined in claim 1 wherein the amorphous semiconductor material comprises $Te_{31-\frac{1}{3}}$, $Se_{31-\frac{1}{3}}$, $Ge_{31-\frac{1}{3}}$ and $As_5$.

81. The amorphous semiconductor member as defined in claim 1 wherein the amorphous semiconductor material comprises $Te_{33-\frac{1}{3}}$, $Se_{33-\frac{1}{3}}$ and $Ge_{33-\frac{1}{3}}$.

82. The amorphous semiconductor member as defined in claim 1 wherein the amorphous semiconductor material comprises As.

83. The amorphous semiconductor member as defined in claim 24 wherein the amorphous semiconductor material comprises Si.

84. The amorphous semiconductor member as defined in claim 24 wherein the amorphous semiconductor material comprises silicon and carbon.

85. The amorphous semiconductor material as defined in claim 24 wherein the amorphous semiconductor material comprises SiC.

86. The amorphous semiconductor member as defined in claim 44 wherein the amorphous semiconductor material comprises $B_4C$.

87. The amorphous semiconductor member as defined in claim 69 wherein the amorphous semiconductor material includes tellurium, selenium and germanium.

88. The amorphous semiconductor member as defined in claim 69 wherein the amorphous semiconductor material includes arsenic.

89. The amorphous semiconductor member as defined in claim 69 wherein the amorphous semiconductor material comprises tellurium, selenium, germanium and arsenic.

90. The amorphous semiconductor member as defined in claim 69 wherein the amorphous semiconductor material comprises $Te_{31-\frac{1}{3}}$, $Se_{31-\frac{1}{3}}$, $Ge_{31-\frac{1}{3}}$ and $As_5$.

91. The amorphous semiconductor member as defined in claim 69 wherein the amorphous semiconductor material comprises $Te_{33-\frac{1}{3}}$, $Se_{33-\frac{1}{3}}$ and $Ge_{33-\frac{1}{3}}$.

92. The amorphous semiconductor member as defined in claim 69 wherein the amorphous semiconductor material comprises As.

93. The amorphous semiconductor member as defined in claim 72 wherein the amorphous semiconductor material comprises Si.

94. The amorphous semiconductor member as defined in claim 72 wherein the amorphous semiconductor material comprises silicon and carbon.

95. The amorphous semiconductor member as defined in claim 72 wherein the amorphous semiconductor material comprises SiC.

96. The amorphous semiconductor member as defined in claim 75 wherein the amorphous semiconductor material comprises $B_4C$.

* * * * *